(12) United States Patent
Thoen

(10) Patent No.: US 9,685,996 B1
(45) Date of Patent: Jun. 20, 2017

(54) ANTENNA COIL TUNING MECHANISM

(71) Applicant: NXP B.V., Eindhoven (NL)

(72) Inventor: Steven Mark Thoen, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/190,826

(22) Filed: Jun. 23, 2016

(51) Int. Cl.
| | |
|---|---|
| *H04B 5/00* | (2006.01) |
| *H04L 7/033* | (2006.01) |
| *H04B 5/02* | (2006.01) |
| *G06K 19/07* | (2006.01) |
| *G06K 7/10* | (2006.01) |
| *H03J 3/20* | (2006.01) |
| *H03J 1/00* | (2006.01) |
| *G06K 19/077* | (2006.01) |

(52) U.S. Cl.
CPC ....... *H04B 5/0081* (2013.01); *G06K 7/10336* (2013.01); *G06K 19/0723* (2013.01); *H03J 1/0008* (2013.01); *H03J 3/20* (2013.01); *H04B 5/0025* (2013.01); *H04B 5/0031* (2013.01); *H04B 5/02* (2013.01); *H04L 7/0331* (2013.01); *G06K 19/07749* (2013.01)

(58) Field of Classification Search
CPC .. H04B 5/0081; H04B 5/0031; H04B 5/1293; H04B 5/00; H04B 5/02; H04B 5/0025; H04L 7/0331; H03J 1/00; H03J 1/0008; H03J 3/20; G06K 19/0723; G06K 19/07749; G06K 7/10336
See application file for complete search history.

(56) References Cited

U.S. PATENT DOCUMENTS

| | | | | |
|---|---|---|---|---|
| 4,136,315 | A * | 1/1979 | Kuhn | B61L 1/188 331/108 D |
| 8,363,757 | B1 * | 1/2013 | Meng | H03J 7/04 370/208 |
| 9,124,302 | B2 * | 9/2015 | Krishnan | H04B 5/00 |
| 9,344,098 | B1 * | 5/2016 | Sfikas | H03L 7/093 |
| 2014/0256270 | A1 * | 9/2014 | Cho | H04B 5/02 455/77 |
| 2015/0333797 | A1 * | 11/2015 | Nejatali | H04B 5/0043 375/376 |
| 2016/0099681 | A1 * | 4/2016 | Zong | H03B 5/1215 331/117 FE |
| 2016/0182263 | A1 * | 6/2016 | Ramakrishnan | H04L 27/04 375/300 |

OTHER PUBLICATIONS

Hunn, Nick; "The Market for Smart Wearable Technology—A Consumer Centric Approach"; WiFore Consulting; retrieved from the internet http://www.nickhunn.com/wp-content/uploads/downloads/2015/07/The-Market-for-Smart-Wearables-Feb-2015-3rd-Edition-rev2.pdf; 63 pages (Feb. 2015).

* cited by examiner

Primary Examiner — Chieh M Fan
Assistant Examiner — Michelle M Koeth

(57) ABSTRACT

Disclosed is an integrated circuit for a near-field radio, including an oscillator configured to output a carrier frequency, an inductor capacitor (LC) tank antenna circuit configured to resonate at a resonance frequency, a frequency measuring circuit configured to measure the resonance frequency of the LC tank antenna circuit and compare the resonance frequency to the carrier frequency, and a controller to adjust the frequency of the LC tank antenna circuit to the carrier frequency.

16 Claims, 2 Drawing Sheets

ANTENNA COIL TUNING MECHANISM

TECHNICAL FIELD

Embodiments described herein generally relate to an apparatus and method for tuning an antenna coil. Such an apparatus and method may be used for various communication systems including those using a magnetic field to communicate such as near field magnetic induction (NFMI). NFMI may be used in truly wireless in-ear headphones, hearing aid instruments, and mission-critical communication.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Various exemplary embodiments are related to an integrated circuit for a near-field radio, including an oscillator configured to output a carrier frequency, an inductor capacitor (LC) tank antenna circuit configured to resonate at a resonance frequency, a frequency measuring circuit configured to measure the resonance frequency of the LC tank antenna circuit and compare the resonance frequency to the carrier frequency, and a controller configured to adjust the frequency of the LC tank antenna circuit to the carrier frequency.

The LC tank antenna circuit may transmit a signal through an inductive coil to induce magnetic induction.

A variable capacitor may be configured tune the transmit frequency of the near-field radio. A variable resistor may be configured to adjust a quality factor of the near-field radio.

The LC tank antenna circuit may include a programmable resistor, a programmable capacitor, and an antenna coil.

The frequency measuring circuit may include a frequency locked loop. The frequency locked loop may include a plurality of counters to compare the carrier frequency to the resonance frequency.

The frequency measuring circuit may include a phase locked loop (PLL). A control voltage of the PLL indicates the resonance frequency of the LC tank antenna circuit.

A feedback circuit may be configured to cause the LC tank antenna circuit to oscillate.

Various exemplary embodiments are also related to a method of tuning a near-field radio, including outputting a carrier frequency of the near-field radio, oscillating the LC tank antenna circuit at a resonance frequency, measuring the resonance frequency and comparing the resonance frequency to the carrier frequency, and adjusting the resonance frequency of the LC tank antenna circuit to the carrier frequency of the near-field radio.

The method may include bringing the LC tank antenna circuit into oscillation by applying positive feedback across the LC tank antenna circuit to resonate the LC tank antenna circuit at the resonance frequency.

Applying the positive feedback may include measuring a level of current input to a feedback circuit to bring the circuit into oscillation. The feedback circuit may include an operational amplifier. The level of current may be used to measure a quality factor of the LC tank antenna circuit.

The method may include adjusting a resistor of the LC tank antenna circuit to tune a bandwidth of the LC tank antenna circuit.

The method may include measuring a frequency offset between the resonance frequency and the carrier frequency using a frequency locked loop.

The method may include measuring a frequency offset between the resonance frequency and the carrier frequency using a phase locked loop. Also, a capacitor of the LC tank antenna circuit may adjust the LC tank antenna circuit frequency.

The method may include converting the resonant frequency signal into a square wave to be input to a frequency measuring circuit.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1:
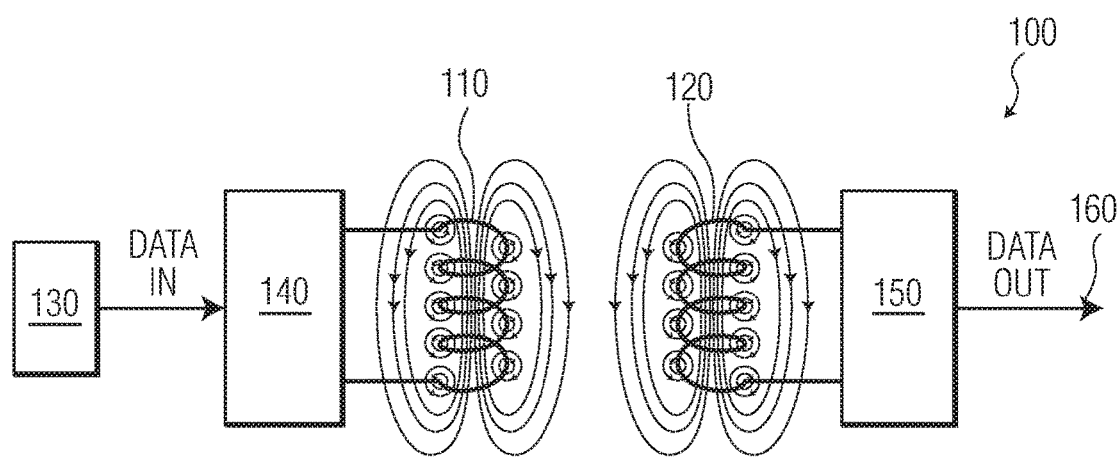
FIG. 1 illustrates magnetic coupling of antenna coils in a near field arrangement in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated. Descriptors such as "first," "second," "third," etc., are not meant to limit the order of elements discussed, are used to distinguish one element from the next, and are generally interchangeable.

Near Field Magnetic Induction (NFMI) technology is an emerging technology being used in lieu of, or sometimes in combination with Bluetooth radio frequency (RF). NFMI is more power-efficient than RF for short distances. The steep degradation of NFMI signal strength as a function of distance increases privacy and reduces issues with interference compared to RF. Less issues with interference means increased robustness. NFMI propagates through the human body with very low absorption, whereas RF does not.

During sports and fitness activities, for example, the wires of today's in-ear headphones (known as earphones, earbuds, etc.) are a genuine inconvenience and can potentially be unsafe. Truly wireless in-ear headphones include wireless audio streaming from ear-to-ear to provide substantially increased user comfort for sport activities, and in general in all situations where wires are undesired, unwanted, and annoying to users.

Existing earbuds have a wired connection from ear to ear. This is largely due to the fact that sending a stereo audio stream towards two distinct earbuds is challenging with today's 2.4 GHz technology. A standard Bluetooth A2DP profile, which supports only point-to-point connections, does not support this use case. Forwarding a high quality audio stream from one ear to the other using reasonable power levels is notoriously difficult using 2.4 GHz technology because most of the signal is absorbed by the human body tissue.

The wireless technology being used to enable truly wireless earbuds is based on Near Field Magnetic Induction (NFMI). NFMI features properties such as ultra-low power consumption and the ability to create a very reliable network in and around the human body, with both high-quality audio and data streaming supported over small distances (<1 m). An additional integration advantage is also that it requires few external components. NFMI is a short range technology and as such also creates a private network, making it is much less susceptible to interference than 2.4 GHz transceivers.

A tuner circuit may include an inductor and capacitor connected in parallel, where the capacitor or inductor is made to be variable. This configuration may create a resonant circuit which responds to an alternating current at one frequency.

FIG. 1 illustrates magnetic coupling of antenna coils in a near field arrangement 100 in accordance with embodiments described herein. Magnetic communication such as NFMI radio or near field communication (NFC) make use of transmitter antenna coil 110 and receiver antenna coil 120, which are magnetically coupled to each other and thus enable communication. Data or audio received from an external source 130 is input to a transmitter circuit 140 that includes transmission processing components and a coil driver. Voice or data may be modulated onto a carrier frequency and transmitted through the transmitter antenna coil 110. At the receive side, the receiver antenna coil 120 when placed proximate to the transmitter antenna coil 110, will energize and receive the modulated carrier signal. Receiver circuit 150 may include a low noise amplifier to amplify the level of the received signal as well as other receive processing components to demodulate the received signal and output data 160 for further use.

Figure 2:
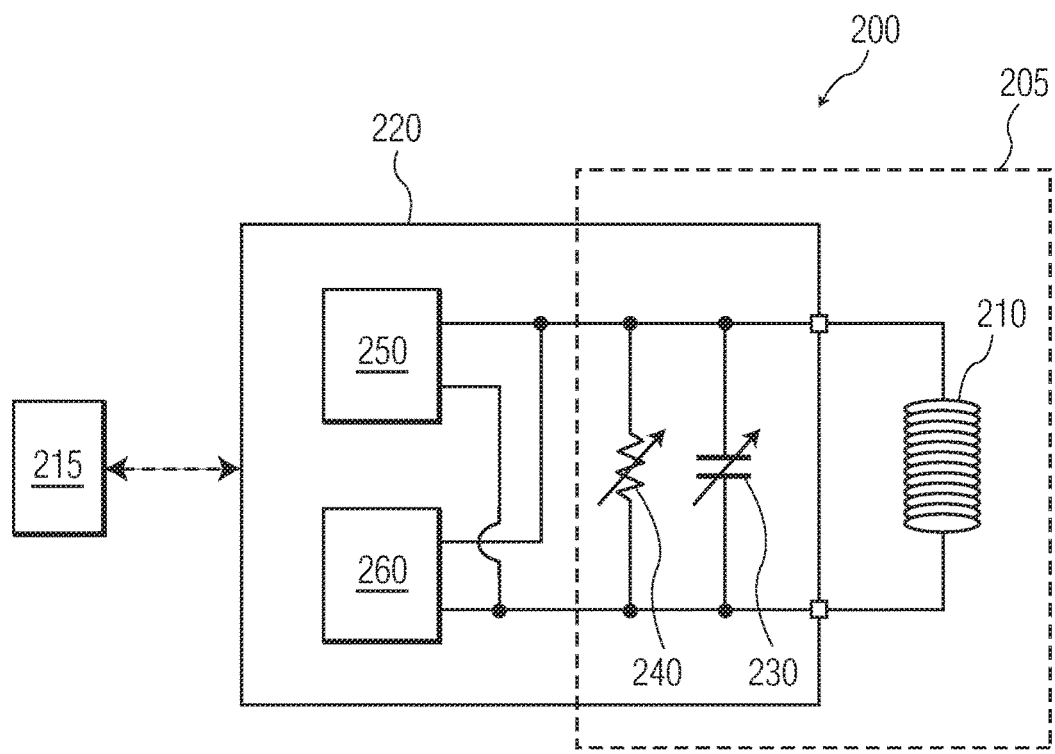
FIG. 2 illustrates a radio transceiver in accordance with embodiments described herein.

FIG. 2 illustrates a radio transceiver 200 in accordance with embodiments described herein. The NFMI radio transceiver 200 may include an LC tank circuit 205. In order to increase a communication range, resonant coils are used such as antenna coil 210 having an inductance L, where the correct amount of capacitance C is added to the coil (either in parallel or series) using programmable capacitor bank 230 to ensure resonance at a carrier frequency. Additionally, a quality factor (Q) of the resulting LC tank circuit 205 is controlled to achieve the right amount of bandwidth for the communication. If the bandwidth of the LC tank circuit 205 is too narrow, the transmitted signal will be distorted, leading to inter-symbol interference (ISI). If the bandwidth of the LC tank circuit 205 is too wide, Q is too low and the achievable range will drop accordingly due to for example increased noise and interference.

The antenna coil 210 may be external or internal to a radio transceiver IC 220 and both its inductance L and Q can vary due to production tolerances and due to nearby metallic objects. The NFMI radio transceiver 200 may be controlled by a controller 215 that is internal or external to the radio transceiver IC 220. In designs that use NFMI radios in accordance with embodiments described herein, there may be a parallel, programmable capacitor bank 230 to tune the resonance frequency of the antenna coil 210 such that the resonance frequency aligns with the carrier frequency (10 MHz for NFMI and 13.56 MHz for NFC). Additionally, a programmable resistor bank 240 is included which can be used to control the Q of LC tank antenna circuit 205.

In order to determine a correct amount of capacitance and resistance to add to the LC tank antenna circuit 205, a coil measurement and tuning algorithm is used. In an existing coil tuning algorithm, three consecutive tones are generated by the controller 215 and output from the transmitter 250.

A tone having a carrier frequency may be represented by f0. This tone is generated by a sending an unmodulated carrier to a transmitter 250. A lower frequency f1=f0−fs/2 is further generated, with fs equal to the baseband symbol rate. This tone may be generated by FSK-modulating a series of 0 bits. A higher frequency of f2=f0+fs/2 is further generated, with fs equal to the baseband symbol rate. This tone may be generated by FSK-modulating a series of 1 bits.

While each tone is applied consecutively to the LC tank antenna circuit 205 by the transmitter 250, a receiver 260 makes a measurement of received signal strength (RSSI). This RSSI measurement is a direct measurement of the frequency response of the LC tank antenna circuit 205 at the tone which is being applied.

Figure 3:
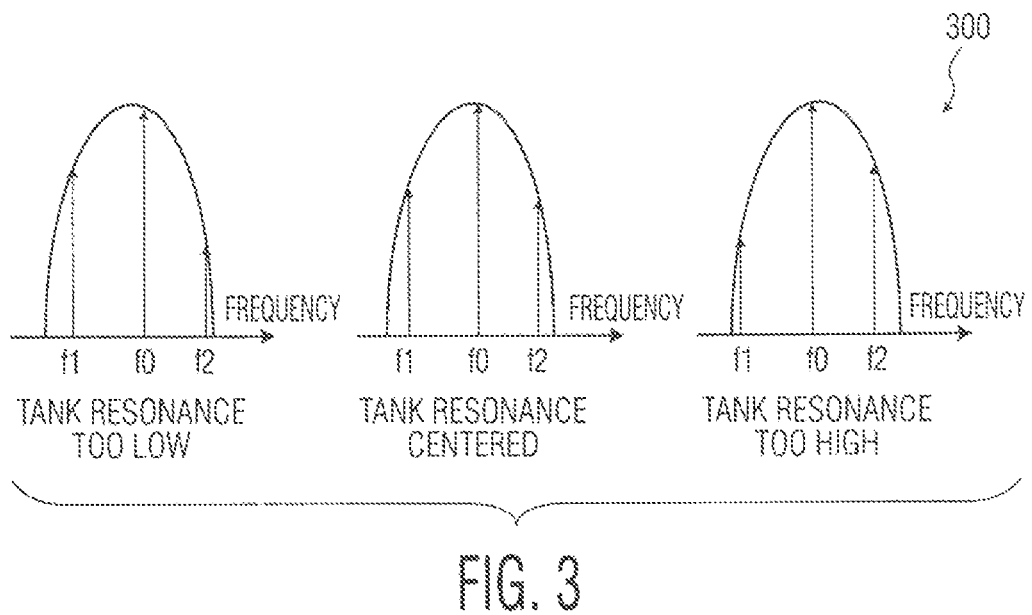
FIG. 3 illustrates LC tank antenna circuit resonance frequency measurement in accordance with embodiments described herein.

FIG. 3 illustrates the LC tank antenna circuit resonance frequency measurement 300 in accordance with embodiments described herein. By comparing the frequency response measurements of the three tones f0, f1, and f2, as illustrated in FIG. 3 the offset of the carrier frequency with respect to the LC tank antenna circuit 205 resonance frequency of FIG. 2 can be estimated. From this offset estimate, a correction to a programmable capacitor bank 230 of FIG. 2 can be derived and applied.

The three tones f0, f1, and f2 are applied sequentially for a certain period of time which includes the time for the LC tank antenna circuit 205 to stabilize to the equilibrium response for each frequency and the time to make an accurate RSSI measurement. LC tank antenna circuit 205 response is measured in terms of voltage, the amplitudes received on the LC tank antenna circuit 205. When well tuned, the carrier frequency f0 should be in the middle, and the lower frequency f1 and higher frequency f2 should be offset, and their measured RSSI should be lower than the RSSI at f0. When the measured RSSI at f1 and f2 are equal, the quality factor Q can be determined by the difference between the RSSI at f0 and f2 or the difference between the RSSI at f0 and f1, which can be used to determined the bandwidth of the LC tank antenna circuit 205. From the three measurements, it can be determined if the LC-tank antenna circuit 205 is offset to the left or to the right, either too high frequency or too low.

In total, the existing tuning algorithm where three consecutive tones are applied, means that tuning the LC-tank antenna circuit 205 takes a significant amount of time and may reduce the effective data rate for the system (during tuning communication is not possible) and requires additional current as the LC-tank antenna circuit 205 may be driven during the whole period.

The frequency span of the 3 tones is limited to fs, the baseband symbol rate. If the LC-tank antenna circuit 205 resonance frequency is outside this frequency span, the algorithm has a hard time distinguishing whether the resonance frequency is higher or lower than the carrier frequency. Then the resonance frequency may be searched for, further increasing the time to tune the receiver.

Figure 4:
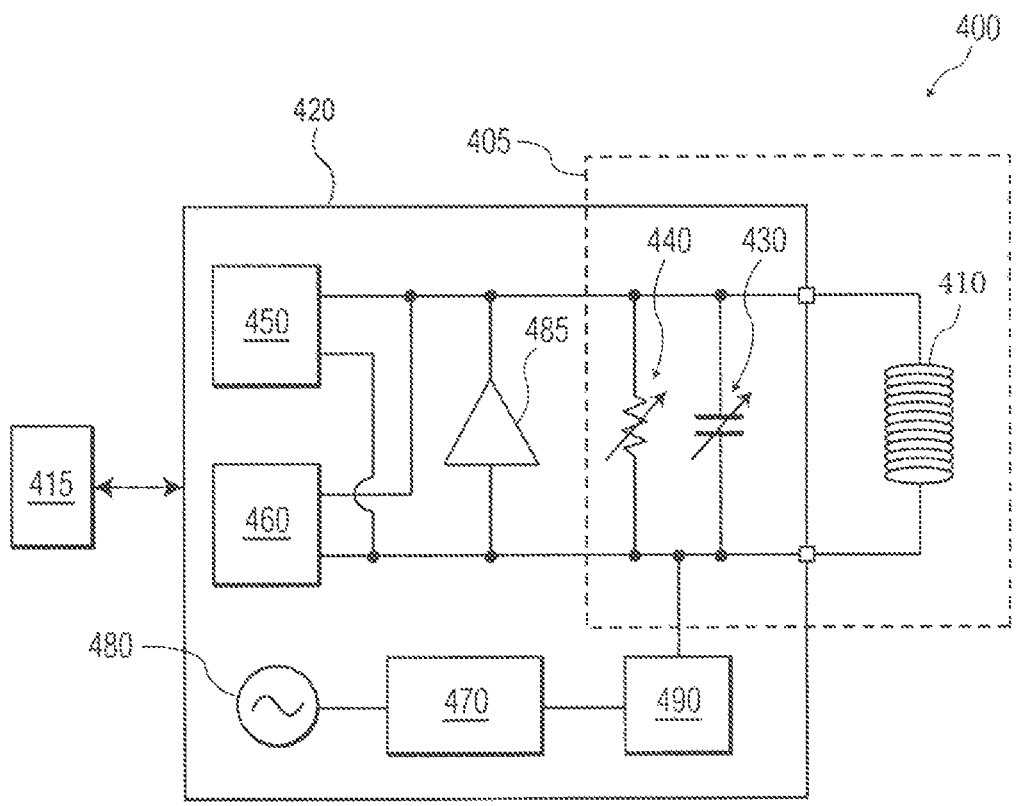
FIG. 4 illustrates a radio transceiver in accordance with embodiments described herein.

FIG. 4 illustrates a radio transceiver 400 in accordance with embodiments described herein. The radio transceiver 400 may include a controller 415, a radio transceiver integrated circuit (IC) 420, and an LC tank antenna circuit 405. The radio transceiver IC 420 may include a transmitter 450 and a receiver 460. The controller 415 may be internal or external to the radio transceiver IC 420. At radio startup, the controller 415 may decide to apply a large amount of positive feedback to the LC tank antenna circuit 405 to start natural oscillation of the LC tank antenna circuit 405.

The LC-tank antenna circuit 405 includes an antenna coil 410, a programmable capacitor 430, and a programmable resistor 440. Rather than probing the LC tank antenna circuit 205 using discrete frequencies to determine the resonance frequency, after start-up the LC tank antenna circuit 405 automatically oscillates at a resonance frequency, corresponding to values of the antenna coil 410 and programmable capacitor 430. Continued oscillation is driven by a positive feedback loop.

The radio controller IC 420 also includes an oscillator 480, a frequency measurement circuit 470, and a slicer 490. Using the frequency measurement circuit 470, the LC tank antenna circuit 405 resonance frequency is measured and compared to a carrier frequency output from the oscillator 480. The resonance frequency is measured to determine an offset between the resonance frequency and the carrier frequency, so that the resonance frequency can be matched with the carrier frequency within a predetermined tolerance of the carrier frequency. The frequency of the oscillation may be measured by a counter or other elements. Upon detecting the offset, the controller 415 may adjust the programmable capacitor 430 to adjust the resonant frequency to the carrier frequency within a predetermined range of the carrier frequency.

Energy from the LC-tank antenna circuit 405 may be amplified using the gain circuit 485 and fed back into the LC tank antenna circuit 405 to continue oscillations of the LC tank antenna circuit 405.

Various frequency measurement circuits 470 may be used to measure the resonance frequency and provide feedback. One example may be using a Frequency Locked Loop (FLL) including two counters. A first counter runs at the carrier frequency f0, which may be generated by the on-chip oscillator 480. A clock for a second counter is a hard-sliced version from a slicer 490 of the LC tank antenna circuit 405 signal. The slicer 490 receives the resonant frequency signal from the LC tank antenna circuit 405, which may be a sine-wave. In order to produce an input that the second counter of the FLL can handle, the slicer 490 may include a Schmitt trigger, a comparator, an analog-to-digital converter (ADC), or other circuits that convert the sine wave into a square wave.

Both counters of the FLL are run for a specific time period to compare a number of cycles produced by each. The oscillator 480 may provide a reference number of cycles for the clock period, for example 10,000 cycles, 16,000 cycles, etc. After the specific time period expires, the number of cycles received from the LC tank antenna circuit 405 are measured and compared to the reference number, and the difference between the two counters will indicate the frequency difference between the reference oscillator 480 and the resonance frequency of the LC tank antenna circuit 405. A variable capacitor 430 can be adjusted so that the LC tank antenna circuit 405 frequency may match the carrier frequency f0 within a predetermined range of the carrier frequency. When using a FLL, the locking range and resolution can be increased by increasing the depth of the counter and the period over which the measurement is performed. Additionally, a programmable resistor bank 440 is included which can be used to control the quality factor of LC-tank antenna circuit 405.

An analog or digital Phase Locked Loop (PLL) may be also used as a frequency measurement circuit 470 to measure the resonance frequency. The reference signal of the PLL would also be the output of the slicer 490 and the oscillator 480 is controlled to vary its frequency until it matches the resonance frequency. Once the PLL has settled, the voltage at the input of the oscillator 480 (which can be measured by an ADC) provides a direct indication of the frequency offset between the LC tank antenna circuit 405 frequency and the oscillator frequency. The proposed scheme has a very wide locking range and high accuracy. In the case of an analog PLL, the locking range is dependent on the locking range of the oscillator, which may be a voltage controlled oscillator (VCO). Resolution in this case is determined by an ADC that measures the control voltage of the VCO.

By using a LC tank antenna circuit 405 in combination with oscillator 480, frequency measurement circuit 470, and slicer 490, the speed of frequency measurement of the LC tank antenna circuit 405 and tuning of the LC tank antenna circuit 405 may increase, as the LC tank antenna circuit 405 may only stabilize once. This leads to reduced power consumption and less impact on system throughput.

To keep the oscillations going in the LC tank antenna circuit 405, the energy lost in each oscillation should be replaced and also the amplitude of these oscillations should be maintained at a constant level. The amount of energy replaced may therefore be equal to the energy lost during each cycle and is determined by the quality factor Q of the tank. By measuring the amount of energy to be provided to the tank to sustain the oscillation, it is possible to directly measure the quality factor and adapt the programmable resistor to tune the tank bandwidth. This is for instance possible by measuring the current going into the operational amplifier 485 that provides the positive feedback to sustain the oscillation, assuming the operational amplifier 485 operates from a fixed voltage supply. Measuring the current is one way of measuring the power entering the operational amplifier 485, by measuring the current with the voltage fixed. Other ways of measuring this energy are possible.

Embodiments described herein can be used in an NFMI-based radio transceiver with which sound can be wirelessly streamed from ear to ear. Devices using this technology can consume as little as 1.5 mW, supporting a maximum bit rate on the order of 596 Kbps. A small mini network is established between the two earphones, which is less susceptible to interference than a Bluetooth connection. Up to 15 devices to be connected together about an NFMI network.

Embodiments described herein may be used in NFMI radios in the Hearables space and to other magnetic systems relying on resonating coils for either communication or power transfer. Examples include all NFC systems as well as power transfer standards such as A4WP.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

The invention claimed is:

1. An integrated circuit for a near-field radio, comprising:
an oscillator configured to output a carrier frequency;
an operational amplifier;
an inductor capacitor (LC) tank antenna circuit configured to sustain oscillation at its resonance frequency by applying positive feedback using the operational amplifier;
a frequency measuring circuit configured to measure the resonance frequency of the LC tank antenna circuit and compare the resonance frequency to the carrier frequency; and
a controller configured to adjust the resonance frequency of the LC tank antenna circuit to the carrier frequency,
wherein the frequency measuring circuit includes a frequency locked loop to determine the frequency difference between the resonance frequency and the carrier frequency.

2. The integrated circuit of claim 1, wherein the LC tank antenna circuit transmits a signal through an inductive coil to induce magnetic induction.

3. The integrated circuit of claim 1, comprising a variable capacitor configured to tune a transmit frequency of the near-field radio.

4. The integrated circuit of claim 1, comprising a variable resistor configured to adjust a quality factor of the near-field radio.

5. The integrated circuit of claim 1, wherein the LC tank antenna circuit includes a programmable resistor, a programmable capacitor, and an antenna coil.

6. The integrated circuit of claim 1, wherein the frequency locked loop includes a plurality of counters to compare the carrier frequency to the resonance frequency.

7. The integrated circuit of claim 1, wherein the frequency measuring circuit includes a phase locked loop (PLL).

8. The integrated circuit of claim 7, wherein a control voltage of the PLL indicates the resonance frequency of the LC tank antenna circuit.

9. The integrated circuit of claim 1, comprising a feedback circuit configured to cause the LC tank antenna circuit to oscillate.

10. A method of tuning a near-field radio, comprising:
outputting a carrier frequency of the near-field radio;
bringing a LC tank antenna circuit into a sustained oscillation by applying positive feedback using an operational amplifier across the LC tank antenna circuit to resonate the LC tank antenna circuit at a resonance frequency;
measuring the resonance frequency using a frequency locked loop and comparing the resonance frequency to the carrier frequency to determine the frequency difference between the resonance frequency and the carrier frequency; and
adjusting the resonance frequency of the LC tank antenna circuit to the carrier frequency of the near-field radio.

11. The method of claim 10, wherein applying the positive feedback includes measuring a level of current input to a feedback circuit to bring the LC tank antenna circuit into oscillation.

12. The method of claim 11, wherein the level of current is used to measure a quality factor of the LC tank antenna circuit.

13. The method of claim 10, comprising adjusting a resistor of the LC tank antenna circuit to tune a bandwidth of the LC tank antenna circuit.

14. The method of claim 10, comprising measuring a frequency offset between the resonance frequency and the carrier frequency using a phase locked loop.

15. The method of claim 10, comprising adjusting a capacitor of the LC tank antenna circuit to adjust the LC tank antenna circuit resonance frequency.

16. The method of claim 10, comprising converting the resonant frequency signal into a square wave to be input to a frequency measuring circuit.

* * * * *